United States Patent
Gallagher et al.

(10) Patent No.: US 7,310,766 B2
(45) Date of Patent: Dec. 18, 2007

(54) END-TO-END DATA INTEGRITY PROTECTION FOR PCI-EXPRESS BASED INPUT/OUTPUT ADAPTER

(75) Inventors: James R. Gallagher, Austin, TX (US); Binh K. Hua, Austin, TX (US); Sivarama K. Kodukula, Round Rock, TX (US); Bruce Henry Ratcliff, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 10/960,607

(22) Filed: Oct. 7, 2004

(65) Prior Publication Data

US 2006/0090116 A1  Apr. 27, 2006

(51) Int. Cl.
*H03M 13/00* (2006.01)
(52) U.S. Cl. .................................. 714/776; 714/774
(58) Field of Classification Search ................ 714/776, 714/774, 758
See application file for complete search history.

(56) References Cited

U.S. PATENT DOCUMENTS

| | | | | |
|---|---|---|---|---|
| 4,907,228 A | * | 3/1990 | Bruckert et al. .............. | 714/11 |
| 5,577,196 A | * | 11/1996 | Peer ............................... | 714/4 |
| 6,647,528 B1 | * | 11/2003 | Collette et al. ............. | 714/758 |
| 2002/0080821 A1 | * | 6/2002 | Hwang ........................ | 370/474 |

* cited by examiner

Primary Examiner—Joseph D. Torres
(74) Attorney, Agent, or Firm—Duke W. Yee; Diana R. Gerhardt; Lisa L. B. Yociss

(57) ABSTRACT

Method, system and computer program product for protecting the integrity of data transferred between an input/output bus of a data processing system and an external network. A method for protecting the integrity of data transferred between an input/output bus and a network includes generating a Cyclic Redundancy Check (CRC) value on an interface between the input/output bus and an adapter for data being transferred from the input/output bus to the network, and checking a CRC value on the interface between the input/output bus and the adapter for data being transferred from the network to the input/output bus. By adding a CRC generator and a CRC checker on the interface between the input/output bus and the adapter, end-to-end data integrity protection is provided for data transferred between the input/output bus and the network.

3 Claims, 3 Drawing Sheets

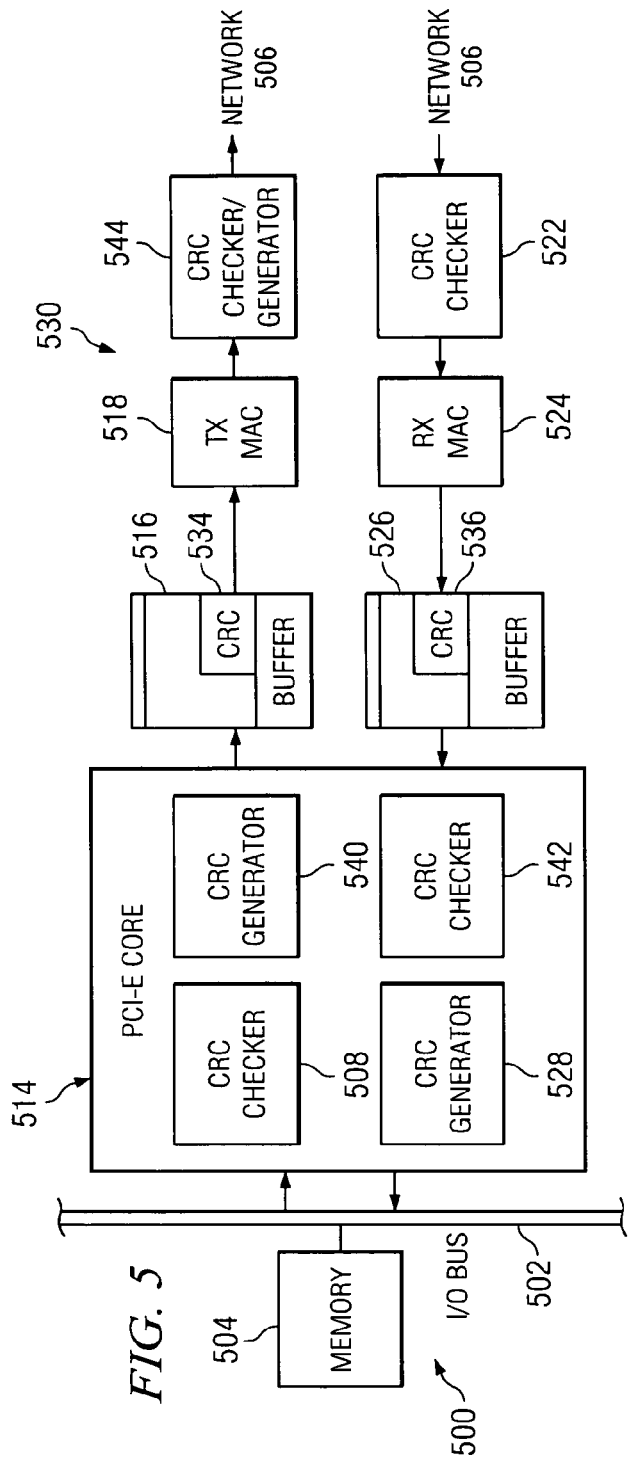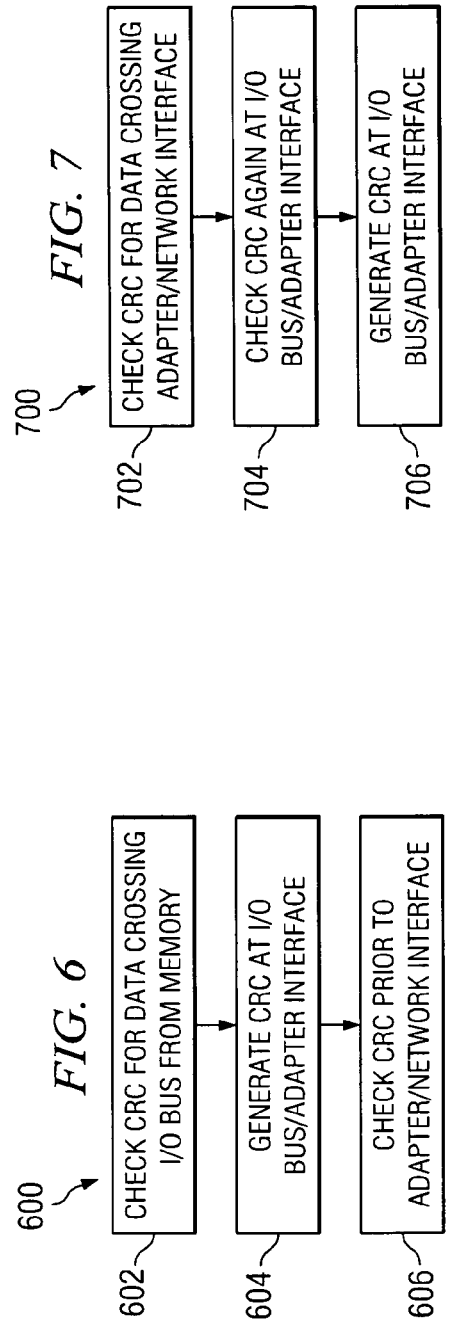

END-TO-END DATA INTEGRITY PROTECTION FOR PCI-EXPRESS BASED INPUT/OUTPUT ADAPTER

BACKGROUND OF THE INVENTION

1. Technical Field

The present invention relates generally to the data processing field and, more particularly, to a method, system and computer program product for protecting the integrity of data transferred between an input/output bus of a data processing system and an external network.

2. Description of Related Art

During the past ten years, LAN (Local Area Network) technology, particularly Ethernet technology, has improved media speed by a factor of ten every three to four years. In contrast, during the same period, CPU (Central Processing Unit) speed has only doubled every two years or so. As a result, CPUs are becoming a bottleneck in high input/output performance systems.

In order to alleviate the additional CPU workload resulting from improvements in media speed, an increasing number of native host functions are being offloaded to the input/output (I/O) adapter. These offloaded functions have, however, created data integrity issues. For cost reasons, it is not customary for adapter vendors to provide adequate error checking for memory elements such as on-chip FIFOs, external memory and other temporary storage.

TCP/IP (Transmission Control Protocol/Internet Protocol) standards enhance data integrity with a "checksum" requirement. This checksum can be implemented in either the host or in adapter logic. When TCP/IP checksum is implemented in the adapter logic, care must be taken to ensure that bad data is detected by the TCP/IP checksum. This can be assured only when all the data paths are error protected along the entire data paths.

With PCI-Express (Peripheral Component Interconnect) bus architecture, the I/O bus protocol has improved data integrity protection with the Cyclic Redundancy Check (CRC) technique for PCI-Express based I/O links. FIG. 4 is a block diagram that schematically illustrates an Ethernet adapter system incorporated in a data processing system having a PCI-Express bus architecture that is known in the art to assist in explaining the present invention. The adapter system is generally designated by reference number 400 and couples an I/O bus 402 of a data processing system to an external network 406 in order to transfer data between memory 404 of the data processing system and network 406.

As shown in FIG. 4, on the transmit path for transferring data from I/O bus 402 to network 406, CRC checker 412 is provided on the interface between I/O bus 402 and adapter 430 that is defined by I/O link 414 specified by PCI-Express architecture. CRC checker 412 checks the CRC value for a data packet crossing I/O bus 402 from memory 404. The data packet is transferred from I/O bus 402 to network 406 through Tx packet buffer 416 and Tx MAC (Media Access Control) 418 on adapter 430, and then to network 406.

Prior to being transferred across the adapter/network interface to network 406, CRC generator 420 on adapter 430 generates a CRC value for the data packet being transferred to network 406.

On the receive path for transferring data from network 406 to I/O bus 402, CRC checker 422 on adapter 430 checks the CRC value for a data packet crossing the adapter/network interface from network 406. The received data is transferred through Rx MAC 424 and Rx packet buffer 426 on adapter 430 to I/O link 414 on the interface between adapter 430 and I/O bus 402. CRC generator 428 on I/O link 414 generates a CRC value for the data packet being transferred across I/O link 414 to I/O bus 402.

Ethernet adapter system 400 only generates and checks the CRC value at the physical layer, and data integrity is protected only on the physical medium in the network. Accordingly, although parity is implemented on the PCI-Express and the adapter's internal memory, the error checking is not as strong as would be provided in an end-to-end CRC implementation because parity does not detect double bit errors or errors associated with addressability.

It would, accordingly, be desirable to provide for end-to-end data integrity protection for data transferred between an input/output bus and an external network in a data processing system.

SUMMARY OF THE INVENTION

The present invention provides a method, system and computer program product for protecting the integrity of data transferred between an input/output bus of a data processing system and an external network. A method for protecting the integrity of data transferred between an input/output bus and a network includes generating a Cyclic Redundancy Check (CRC) value on an interface between the input/output bus and an adapter for data being transferred from the input/output bus to the network, and checking a CRC value on the interface between the input/output bus and the adapter for data being transferred from the network to the input/output bus. By adding a CRC generator and a CRC checker on the interface between the input/output bus and the adapter, end-to-end data integrity protection is provided for data transferred between the input/output bus and the network.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 is a block diagram that schematically illustrates an Ethernet adapter system incorporated in a data processing system having a PCI-Express bus architecture in accordance with a preferred embodiment of the present invention;

FIG. 6 is a flowchart that illustrates a method for protecting the integrity of data transferred from an input/output bus of a data processing system to an external network in accordance with a preferred embodiment of the present invention; and FIG. 7 is a flowchart that illustrates a method for protecting the integrity of data transferred from an external network to an input/output bus of a data processing system in accordance with a preferred embodiment of the present invention.

DETAILED DESCRIPTION OF THE PREFERRED EMBODIMENT

Figure 1:
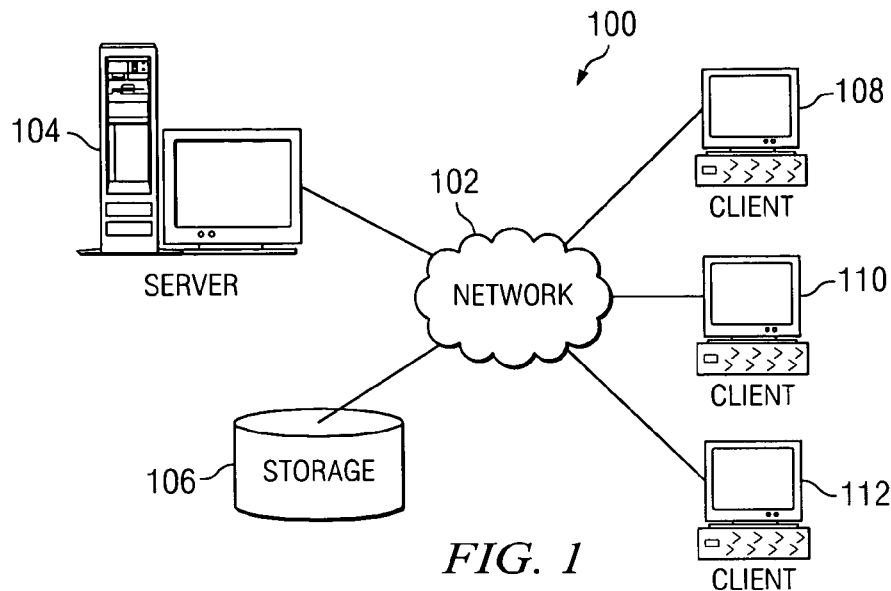
FIG. 1 is a pictorial representation of a network of data processing systems in which the present invention may be implemented.

With reference now to the figures, FIG. 1 depicts a pictorial representation of a network of data processing systems in which the present invention may be implemented. Network data processing system 100 is a network of computers in which the present invention may be implemented. Network data processing system 100 contains a network 102, which is the medium used to provide communications links between various devices and computers connected together within network data processing system 100. Network 102 may include connections, such as wire, wireless communication links, or fiber optic cables.

In the depicted example, server 104 is connected to network 102 along with storage unit 106. In addition, clients 108, 110, and 112 are connected to network 102. These clients 108, 110, and 112 may be, for example, personal computers or network computers. In the depicted example, server 104 provides data, such as boot files, operating system images, and applications to clients 108-112. Clients 108, 110, and 112 are clients to server 104. Network data processing system 100 may include additional servers, clients, and other devices not shown. In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, government, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the present invention.

Figure 2:
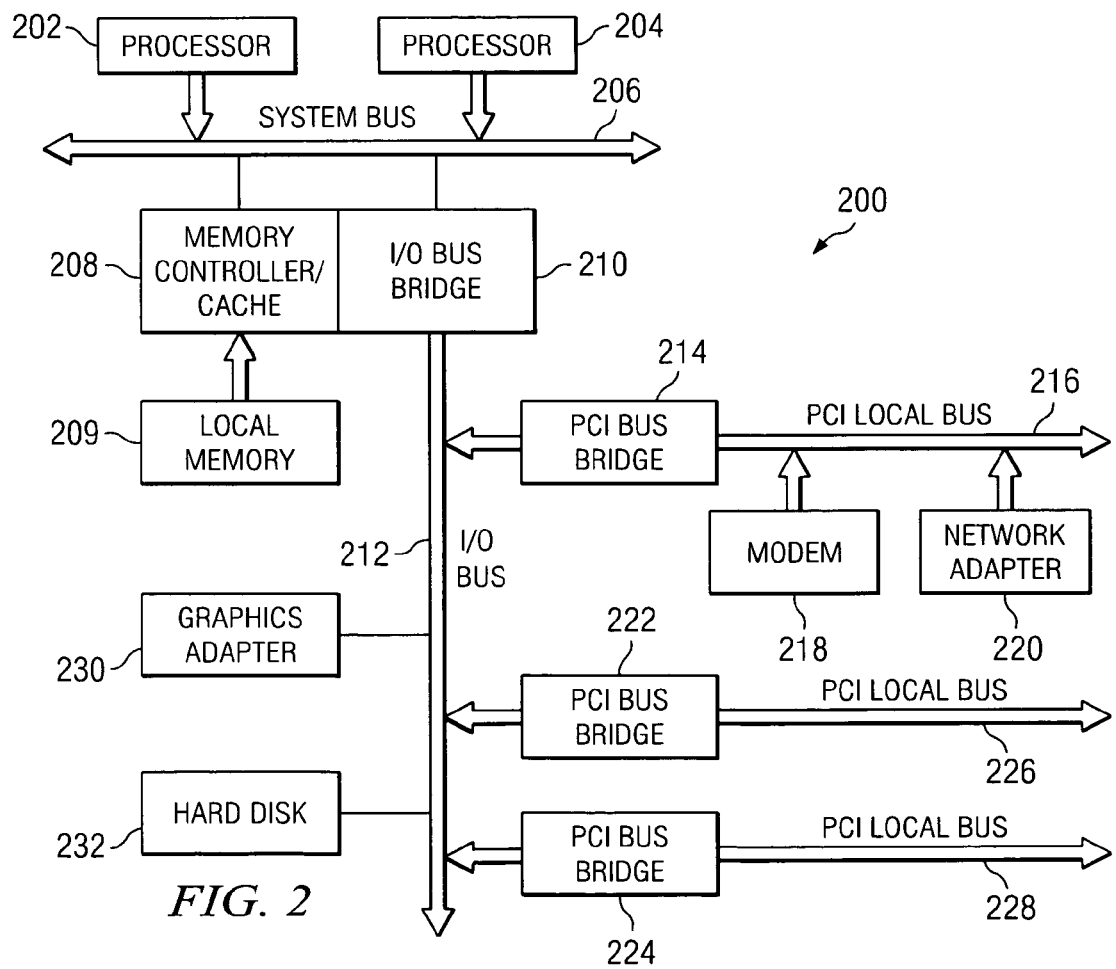
FIG. 2, a block diagram of a data processing system that may be implemented as a server in accordance with a preferred embodiment of the present invention.

Referring to FIG. 2, a block diagram of a data processing system that may be implemented as a server, such as server 104 in FIG. 1, is depicted in accordance with a preferred embodiment of the present invention. Data processing system 200 may be a symmetric multiprocessor (SMP) system including a plurality of processors 202 and 204 connected to system bus 206. Alternatively, a single processor system may be employed. Also connected to system bus 206 is memory controller/cache 208, which provides an interface to local memory 209. I/O Bus Bridge 210 is connected to system bus 206 and provides an interface to I/O bus 212. Memory controller/cache 208 and I/O Bus Bridge 210 may be integrated as depicted.

Peripheral component interconnect (PCI) bus bridge 214 connected to I/O bus 212 provides an interface to PCI local bus 216. A number of modems may be connected to PCI local bus 216. Typical PCI bus implementations will support four PCI expansion slots or add-in connectors. Communications links to clients 108-112 in FIG. 1 may be provided through modem 218 and network adapter 220 connected to PCI local bus 216 through add-in connectors.

Additional PCI bus bridges 222 and 224 provide interfaces for additional PCI local buses 226 and 228, from which additional modems or network adapters may be supported. In this manner, data processing system 200 allows connections to multiple network computers. A memory-mapped graphics adapter 230 and hard disk 232 may also be connected to I/O bus 212 as depicted, either directly or indirectly.

Those of ordinary skill in the art will appreciate that the hardware depicted in FIG. 2 may vary. For example, other peripheral devices, such as optical disk drives and the like, also may be used in addition to or in place of the hardware depicted. The depicted example is not meant to imply architectural limitations with respect to the present invention.

The data processing system depicted in FIG. 2 may be, for example, an IBM eServer pSeries system, a product of International Business Machines Corporation in Armonk, N.Y., running the Advanced Interactive Executive (AIX) operating system or LINUX operating system.

Figure 3:
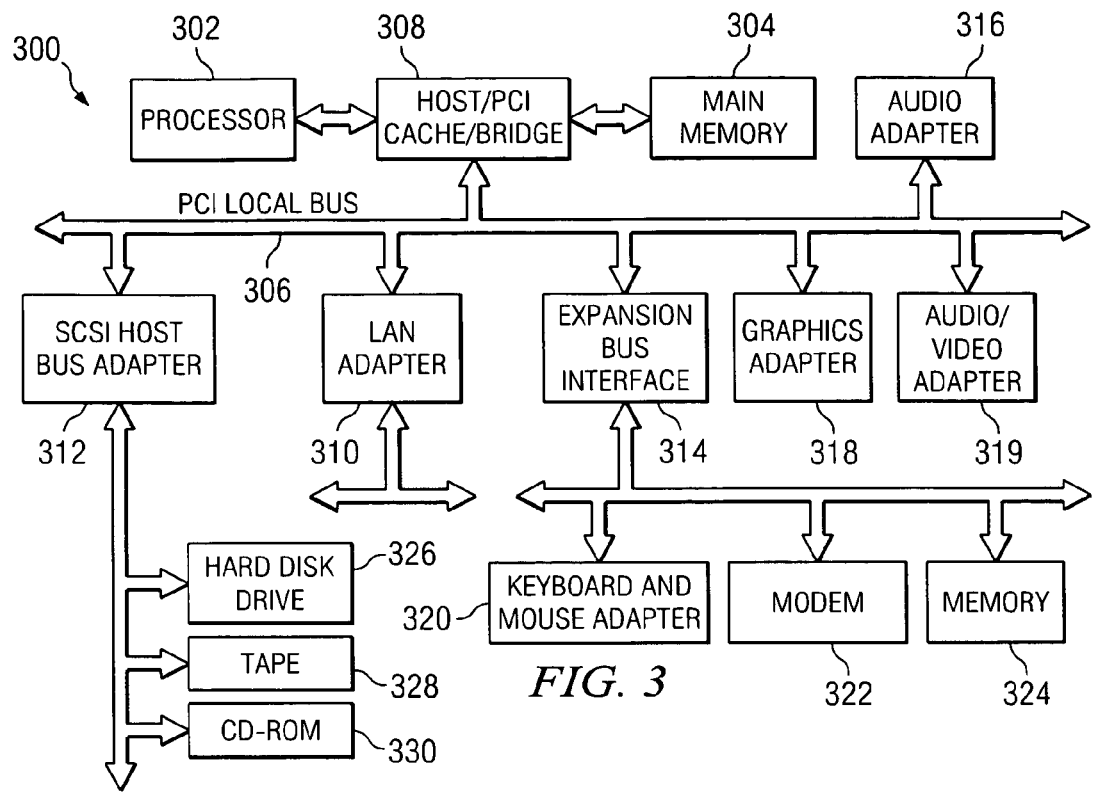
FIG. 3, a block diagram of a data processing system that may be implemented as a client in accordance with a preferred embodiment of the present invention.

With reference now to FIG. 3, a block diagram illustrating a data processing system is depicted in which the present invention may be implemented. Data processing system 300 is an example of a client computer. Data processing system 300 employs a peripheral component interconnect (PCI) local bus architecture. Although the depicted example employs a PCI bus, other bus architectures such as Accelerated Graphics Port (AGP) and Industry Standard Architecture (ISA) may be used. Processor 302 and main memory 304 are connected to PCI local bus 306 through PCI Bridge 308. PCI Bridge 308 also may include an integrated memory controller and cache memory for processor 302. Additional connections to PCI local bus 306 may be made through direct component interconnection or through add-in boards. In the depicted example, local area network (LAN) adapter 310, small computer system interface (SCSI) host bus adapter 312, and expansion bus interface 314 are connected to PCI local bus 306 by direct component connection. In contrast, audio adapter 316, graphics adapter 318, and audio/video adapter 319 are connected to PCI local bus 306 by add-in boards inserted into expansion slots. Expansion bus interface 314 provides a connection for a keyboard and mouse adapter 320, modem 322, and additional memory 324. SCSI host bus adapter 312 provides a connection for hard disk drive 326, tape drive 328, and CD-ROM drive 330. Typical PCI local bus implementations will support three or four PCI expansion slots or add-in connectors.

An operating system runs on processor 302 and is used to coordinate and provide control of various components within data processing system 300 in FIG. 3. The operating system may be a commercially available operating system, such as Windows XP, which is available from Microsoft Corporation. An object oriented programming system such as Java may run in conjunction with the operating system and provide calls to the operating system from Java programs or applications executing on data processing system 300. "Java" is a trademark of Sun Microsystems, Inc. Instructions for the operating system, the object-oriented programming system, and applications or programs are located on storage devices, such as hard disk drive 326, and may be loaded into main memory 304 for execution by processor 302.

Those of ordinary skill in the art will appreciate that the hardware in FIG. 3 may vary depending on the implementation. Other internal hardware or peripheral devices, such as flash read-only memory (ROM), equivalent nonvolatile memory, or optical disk drives and the like, may be used in addition to or in place of the hardware depicted in FIG. 3. Also, the processes of the present invention may be applied to a multiprocessor data processing system.

As another example, data processing system 300 may be a stand-alone system configured to be bootable without relying on some type of network communication interfaces As a further example, data processing system 300 may be a personal digital assistant (PDA) device, which is configured with ROM and/or flash ROM in order to provide non-volatile memory for storing operating system files and/or user-generated data.

The depicted example in FIG. 3 and above-described examples are not meant to imply architectural limitations. For example, data processing system 300 also may be a notebook computer or hand held computer in addition to taking the form of a PDA. Data processing system 300 also may be a kiosk or a Web appliance.

The present invention provides end-to-end data integrity protection for data transferred between an input/output bus of a data processing system, such as system 200 in FIG. 2, and an external network, such as network 102 in FIG. 1.

According to a preferred embodiment of the present invention, end-to-end data integrity protection is provided by adding CRC generator and CRC checker logic on the interface between an I/O bus having a PCI-Express bus architecture and an Ethernet I/O adapter. The new logic generates a CRC value for a data packet that DMAs to the adapter, and checks the CRC value for a data packet that DMAs to the data processing system memory.

FIG. 5 is a block diagram that schematically illustrates an Ethernet adapter system incorporated in a data processing system having a PCI-Express bus architecture in accordance with a preferred embodiment of the present invention. The Ethernet adapter system is generally designated by reference number 500, and is similar in many respects to Ethernet adapter system 400 in FIG. 4, and similar components are designated by corresponding reference numbers in FIG. 5. For example, a Tx MAC 518 and an Rx MAC 524, depicted in FIG. 5, correspond to Tx MAC 418 and Rx MAC 424, depicted in FIG. 4. A CRC Checker 508 and CRC Generator 528 are also included in PCI-Express Core 514, which correspond to CRC Checker 412 and CRC Generator 428, respectively.

Figure 4:
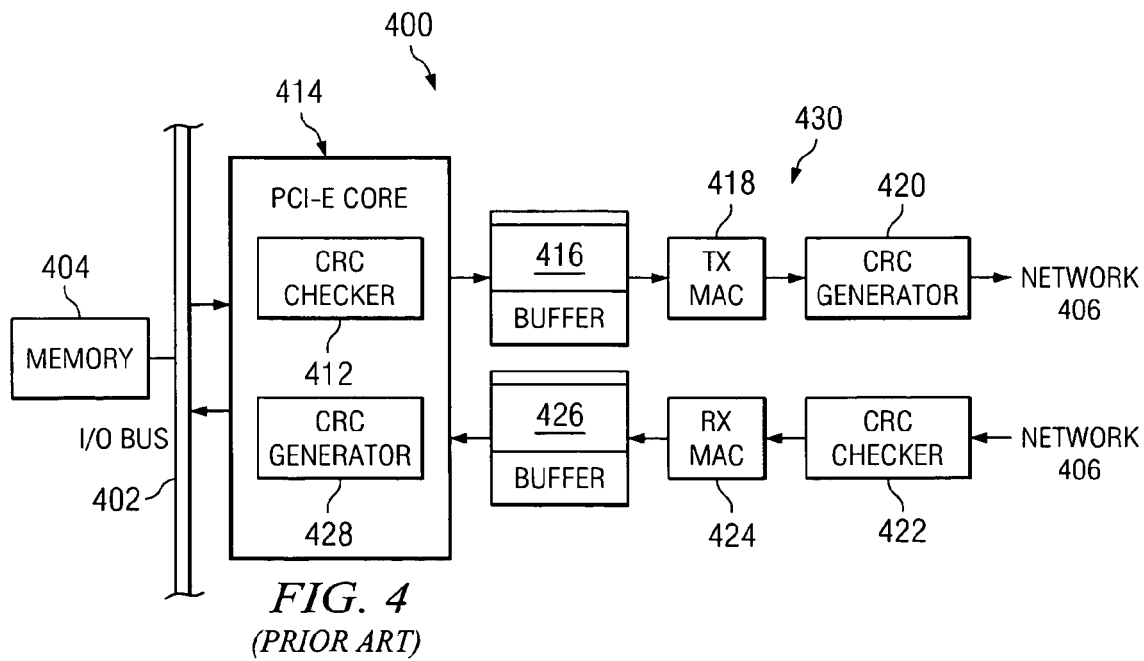
FIG. 4 is a block diagram that schematically illustrates an Ethernet adapter system incorporated in a data processing system having a PCI-Express bus architecture that is known in the art to assist in explaining the present invention.

Adapter system 500 in FIG. 5 differs from adapter system 400 in FIG. 4 in that adapter system 500 further includes CRC generator 540 in PCI-Express core 514 on the interface between I/O bus 502 and I/O adapter 530 in the transmit path for data transferred from I/O bus 502 to network 506, and a CRC checker 542 in PCI-Express core 514 on the interface between I/O bus 502 and adapter 530 in the receive path for data transferred from network 506 to I/O bus 502.

In adapter system 500, CRC generator 540 generates a CRC value for a data packet when the data packet crosses I/O bus 502 from data processing system memory 504. CRC checker/generator 544 on adapter 530 then checks the CRC value just before the data crosses the interface between adapter 530 and network 506. CRC generator 540, in conjunction with CRC checker/generator 544 thus protects the integrity of data being transferred from I/O bus 502 to network 506 between the I/O bus/adapter interface and the adapter/network interface.

In the receive path, CRC checker 522 checks the CRC value for a data packet crossing the adapter/network interface from network 506, and new CRC checker 542 checks the CRC value again when the adapter's DMA engine sends the data packet across the I/O bus/adapter interface to data processing system memory 504. Accordingly, the integrity of data being transferred from network 506 to memory 504 is protected between the adapter/network interface and the I/O bus/adapter interface.

As also shown in FIG. 5, the CRC value generated by CRC generator 540 is stored in Tx packet buffer 516 as shown at 534 and the CRC value for a data packet from network 506 is stored in Rx packet buffer 526 as shown at 536.

By including a CRC generator in the transmit path, and a CRC checker in the receive path on the interface between I/O bus 502 and adapter 530, end-to-end data integrity protection is provided, and the adapter is made robust enough to offload the TCP/IP checksum on to the adapter, ensuring the checksum is always calculated based on good data.

FIG. 6 is a flowchart that illustrates a method for protecting the integrity of data transferred from an input/output bus of a data processing system to a network in accordance with a preferred embodiment of the present invention. The method is generally designated by reference number 600, and begins by checking the CRC value for a data packet crossing an I/O bus from a memory of a data processing system to an Ethernet I/O adapter (Step 602). A CRC value for the data packet is then generated on the I/O bus/adapter interface (Step 604). The CRC value is then again checked just prior to sending the data packet across the adapter/network interface to a network (Step 606).

FIG. 7 is a flowchart that illustrates a method for protecting the integrity of data transferred from a network to an input/output bus of a data processing system in accordance with a preferred embodiment of the present invention. The method is generally designated by reference number 700, and begins by checking the CRC value for a data packet crossing a network/adapter interface from a network (Step 702). The CRC value is then checked again on the interface between the adapter and an I/O bus when the adapter's DMA engine sends the data packet to a memory of a data processing system (Step 704). After being checked again in Step 704, a CRC value is generated on the interface between the adapter and the I/O bus (Step 706).

The present invention thus provides a method, system and computer program product for protecting the integrity of data transferred between an input/output bus of a data processing system and an external network. A method for protecting the integrity of data transferred between an input/output bus and a network includes generating a Cyclic Redundancy Check (CRC) value on an interface between the input/output bus and an adapter for data being transferred from the input/output bus to the network, and checking a CRC value on the interface between the input/output bus and the adapter for data being transferred from the network to the input/output bus. By adding a CRC generator and a CRC checker on the interface between the input/output bus and the adapter, end-to-end data integrity protection is provided for data transferred between the input/output bus and the network.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, and DVD-ROMs. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for protecting the integrity of data transferred between an input/output (I/O) bus and a network, the method comprising:
   connecting the I/O bus to a PCI-Express core interface;
   connecting an Ethernet adapter to the PCI-Express core interface, the Ethernet adapter for connecting to the network;
   data that is transmitted from the I/O bus to the network being transmitted as transmit data from the I/O bus to the PCI-Express core interface, the PCI-Express core interface transmitting the transmit data to the Ethernet adapter, and the Ethernet adapter transmitting the transmit data to the network;
   data that is transmitted from the network to the I/O bus being transmitted as receive data from the network to the Ethernet adapter, the Ethernet adapter transmitting the receive data to the PCI-Express core interface, and the PCI-Express core interface transmitting the receive data to the I/O bus;
   a transmit path for transmitting the transmit data from the I/O bus to the network including: a first CRC checker in the PCI-Express core interface, a first CRC generator in the PCI-Express core interface, a transmit buffer in the Ethernet adapter, and a second CRC generator/checker in the Ethernet adapter;
   a receive path for receiving the receive data by the I/O bus from the network including: a third CRC checker in the Ethernet adapter, a receive buffer in the Ethernet adapter, a fourth CRC checker in the PCI-Express core interface, and a third CRC generator in the PCI-Express core interface;
   protecting the integrity of a first data packet that is transmitted from the I/O bus to the network including:
     receiving, within the PCI-Express core interface, the first data packet from the I/O bus;
     checking, using the first CRC checker in the PCI-Express core interface, a CRC value for the first data packet;
     generating, by the first CRC generator in the PCI-Express core interface, a second CRC value for the first data packet;
     storing, in the transmit buffer in the Ethernet adapter, the second CRC value;
     checking, using the second CRC checker/generator in the Ethernet adapter, the second CRC value prior to sending the first data packet to the network;
   protecting the integrity of a second data packet that is transmitted from the network to the I/O bus including:
     receiving, within the Ethernet adapter, the second data packet from the network;
     checking, using the third CRC checker in the Ethernet adapter, a third CRC value for the second data packet;
     storing the third CRC value in the receive buffer in the Ethernet adapter;
     checking, using the fourth CRC checker in the PCI-Express core interface, the third CRC value; and
     generating, by the third CRC generator in the PCI-Express core interface, a fourth CRC value for the second data packet.

2. A data processing system; comprising:
   an I/O bus connected to a PCI-Express core interface;
   an Ethernet adapter connected to the PCI-Express core interface, the Ethernet adapter for connecting to the network;
   data that is transmitted from the I/O bus to the network being transmitted as transmit data from the I/O bus to the PCI-Express core interface, the PCI-Express core interface transmitting the transmit data to the Ethernet adapter, and the Ethernet adapter transmitting the transmit data to the network;
   data that is transmitted from the network to the I/O bus being transmitted as receive data from the network to the Ethernet adapter, the Ethernet adapter transmitting the receive data to the PCI-Express core interface, and the PCI-Express core interface transmitting the receive data to the I/O bus;
   a transmit path for transmitting the transmit data from the I/O bus to the network including: a first CRC checker in the PCI-Express core interface, a first CRC generator in the PCI-Express core interface, a transmit buffer in the Ethernet adapter, and a second CRC generator/checker in the Ethernet adapter;
   a receive path for receiving the receive data by the I/O bus from the network including: a third CRC checker in the Ethernet adapter, a receive buffer in the Ethernet adapter, a fourth CRC checker in the PCI-Express core interface, and a third CRC generator in the PCI-Express core interface;
   protecting means for protecting the integrity of a first data packet that is transmitted from the I/O bus to the network including:
     the PCI-Express core interface receiving the first data packet from the I/O bus;
     the first CRC checker in the PCI-Express core interface for checking a CRC value for the first data packet;
     the first CRC generator in the PCI-Express core interface generating a second CRC value for the first data packet;
     the transmit buffer in the Ethernet adapter storing the second CRC value;
     the second CRC checker/generator in the Ethernet adapter checking the second CRC value prior to sending the first data packet to the network;
   protecting means for protecting the integrity of a second data packet that is transmitted from the network to the I/O bus including:
     the Ethernet adapter receiving the second data packet from the network;
     the third CRC checker in the Ethernet adapter checking a third CRC value for the second data packet;
     the receive buffer in the Ethernet adapter storing the third CRC value;
     the fourth CRC checker in the PCI-Express core interface checking the third CRC value; and
     the third CRC generator in the PCI-Express core interface generating a fourth CRC value for the second data packet.

3. A computer program product that is stored in a computer readable medium for protecting the integrity of data transferred between an input/output (I/O) bus and a network, comprising:
    connecting the I/O bus to a PCI-Express core interface;
    connecting an Ethernet adapter to the PCI-Express core interface, the Ethernet adapter for connecting to the network;
    data that is transmitted from the I/O bus to the network being transmitted as transmit data from the I/O bus to the PCI-Express core interface, the PCI-Express core interface transmitting the transmit data to the Ethernet adapter, and the Ethernet adapter transmitting the transmit data to the network;
    data that is transmitted from the network to the I/O bus being transmitted as receive data from the network to the Ethernet adapter, the Ethernet adapter transmitting the receive data to the PCI-Express core interface, and the PCI-Express core interface transmitting the receive data to the I/O bus;
    a transmit path for transmitting the transmit data from the I/O bus to the network including: a first CRC checker in the PCI-Express core interface, a first CRC generator in the PCI-Express core interface, a transmit buffer in the Ethernet adapter, and a second CRC generator/checker in the Ethernet adapter;
    a receive path for receiving the receive data by the I/O bus from the network including: a third CRC checker in the Ethernet adapter, a receive buffer in the Ethernet adapter, a fourth CRC checker in the PCI-Express core interface, and a third CRC generator in the PCI-Express core interface;
    instructions for protecting the integrity of a first data packet that is transmitted from the I/O bus to the network including:
        instructions for receiving, within the PCI-Express core interface, the first data packet from the I/O bus;
        instructions for checking, using the first CRC checker in the PCI-Express core interface, a CRC value for the first data packet;
        instructions for generating, by the first CRC generator in the PCI-Express core interface, a second CRC value for the first data packet;
        instructions for storing, in the transmit buffer in the Ethernet adapter, the second CRC value;
        instructions for checking, using the second CRC checker/generator in the Ethernet adapter, the second CRC value prior to sending the first data packet to the network;
    instructions for protecting the integrity of a second data packet that is transmitted from the network to the I/O bus including:
        instructions for receiving, within the Ethernet adapter, the second data packet from the network;
        instructions for checking, using the third CRC checker in the Ethernet adapter, a third CRC value for the second data packet;
        instructions for storing the third CRC value in the receive buffer in the Ethernet adapter;
        instructions for checking, using the fourth CRC checker in the PCI-Express core interface, the third CRC value; and
        instructions for generating, by the third CRC generator in the PCI-Express core interface, a fourth CRC value for the second data packet.

* * * * *